United States Patent [19]
Okazaki

(10) Patent No.: US 6,542,223 B1
(45) Date of Patent: Apr. 1, 2003

(54) SCANNING TYPE EXPOSURE UNIFORMIZING SYSTEM AND METHOD

(76) Inventor: Yoichi Okazaki, c/o NEC Corporation, 7-1, Shiba 5-chome, Minato-ku, Tokyo (JP)

( * ) Notice: Subject to any disclaimer, the term of this patent is extended or adjusted under 35 U.S.C. 154(b) by 40 days.

(21) Appl. No.: 09/628,885

(22) Filed: Jul. 31, 2000

(30) Foreign Application Priority Data

Jul. 29, 1999 (JP) .......................................... 11-215185

(51) Int. Cl.[7] .......................... G03B 27/54; G03B 27/42
(52) U.S. Cl. .......................................... 355/67; 355/53
(58) Field of Search ...................... 355/67, 53; 356/399, 356/400, 401; 250/201.1

(56) References Cited

U.S. PATENT DOCUMENTS 5,473,410 A    12/1995   Nishi
5,591,958 A    1/1997    Nishi et al.

FOREIGN PATENT DOCUMENTS

| EP | 0614124 A2 | 7/1994 | ............. G03F/7/20 |
| EP | 0633506 A1 | 11/1995 | ............. G03F/7/20 |
| EP | 0869396 A2 | 7/1998 | ............. G03F/7/20 |
| JP | 06-347921 | 12/1994 | ............. G03B/27/72 |
| JP | 7-142313 | 2/1995 | ............. H01L/21/02 |
| JP | 07-135146 | 5/1995 | ......... H01L/21/027 |
| JP | 08-33020 | 12/1996 | ......... H01L/21/027 |

*Primary Examiner*—Russell Adams
*Assistant Examiner*—Peter B. Kim

(57) ABSTRACT

In a scanning type exposure apparatus, an illumination light beam from a light source through an opening portion of a reticle blind is introduced onto a reticle. A pattern on the reticle is sequentially transferred onto the substrate by scanning the reticle and the substrate, respectively. The substrate is divided into a plurality of regions along a scanning direction. A variable unit for changing an opening area of the opening portion is arranged so as to substantially equalize integrated exposure quantity in each region.

7 Claims, 7 Drawing Sheets

SCANNING TYPE EXPOSURE UNIFORMIZING SYSTEM AND METHOD

BACKGROUND OF THE INVENTION

This invention relates to a scanning type exposure apparatus and, in particular, to a scanning type exposure apparatus for equalizing in-plane exposure quantity.

Referring to FIG. 1, a conventional scanning type exposure apparatus will first be described.

In FIG. 1, an exposure light beam 2 is outputted from a light source 1, such as a laser and a lamp. The exposure light beam 2 passes through an optical system 3, such as a lens, and is introduced into a substrate 4 on a substrate stage.

With such a structure, an exposure area is controlled by the use of a reticle blind 5. Further, the exposure light beam 2 irradiates a surface of the reticle 6. The exposure light beam 2 passing the reticle 6 illuminates the surface of the substrate 4.

In such a scanning type exposure apparatus, the reticle 6 is scanned in the direction indicated by the arrow illustrated in FIG. 1, while the substrate 4 is reversely scanned in synchronism with the reticle 6.

Under this circumstance, a pattern on the reticle 6 is sequentially transferred onto the substrate 4.

For example, this kind of scanning type exposure apparatus is disclosed in Japanese Unexamined Patent Publication No. Hei. 7-142313.

However, each illuminance is uniform in each region of the substrate having a wide area in the above-mentioned conventional scanning apparatus.

Consequently, it is difficult to accurately transfer the pattern when the pattern is further reduced in size.

SUMMARY OF THE INVENTION

It is therefore an object of this invention to provide a scanning type exposure apparatus which is capable of keeping in-plane illuminance uniform in a substrate having a wide area.

It is another object of this invention to provide a scanning type exposure apparatus which is capable of accurately transferring a fine pattern.

In a scanning type exposure apparatus according to this invention, an illumination light beam from a light source through an opening portion of a reticle blind is introduced onto a reticle.

Further, a pattern on the reticle is sequentially transferred onto the substrate by scanning the reticle and the substrate, respectively.

Under this circumstance, the substrate is divided into a plurality of regions along a scanning direction.

Moreover, a variable unit for changing an opening area of the opening portion of the reticle blind is arranged so as to substantially equalize integrated exposure quantity in each region.

In this case, the variable unit is controlled in synchronism with the scanning of the reticle and the substrate.

In another scanning type exposure apparatus according to this invention, an illumination light beam from a light source through an opening portion of a reticle blind is introduced onto a reticle.

Further, a pattern on the reticle is sequentially transferred onto the substrate by scanning the reticle and the substrate, respectively.

With such a structure, the reticle blind forms the opening portion by overlapping a first light shielding plate with a second light shielding plate.

Further, a side parallel to the scanning direction of the opening portion constitutes one side of the opening portion formed in the first light shielding plate.

Moreover, the length of a side perpendicular to the scanning direction of the opening portion of the reticle blind is determined on the basis of the second light shielding plate.

In the scanning type exposure apparatus, a driving unit is arranged so as to drive either the first or second light shielding plate in synchronism with the scanning of the reticle and the substrate.

In this event, the length is determined on the basis of an adjusting region provided at one side portion parallel to the scanning direction of the second light shielding plate.

Alternatively, the length may be determined on the basis of adjusting regions provided at both side portions parallel to the scanning direction of the second light shielding plate.

DESCRIPTION OF PREFERRED EMBODIMENT

Figure 2A:
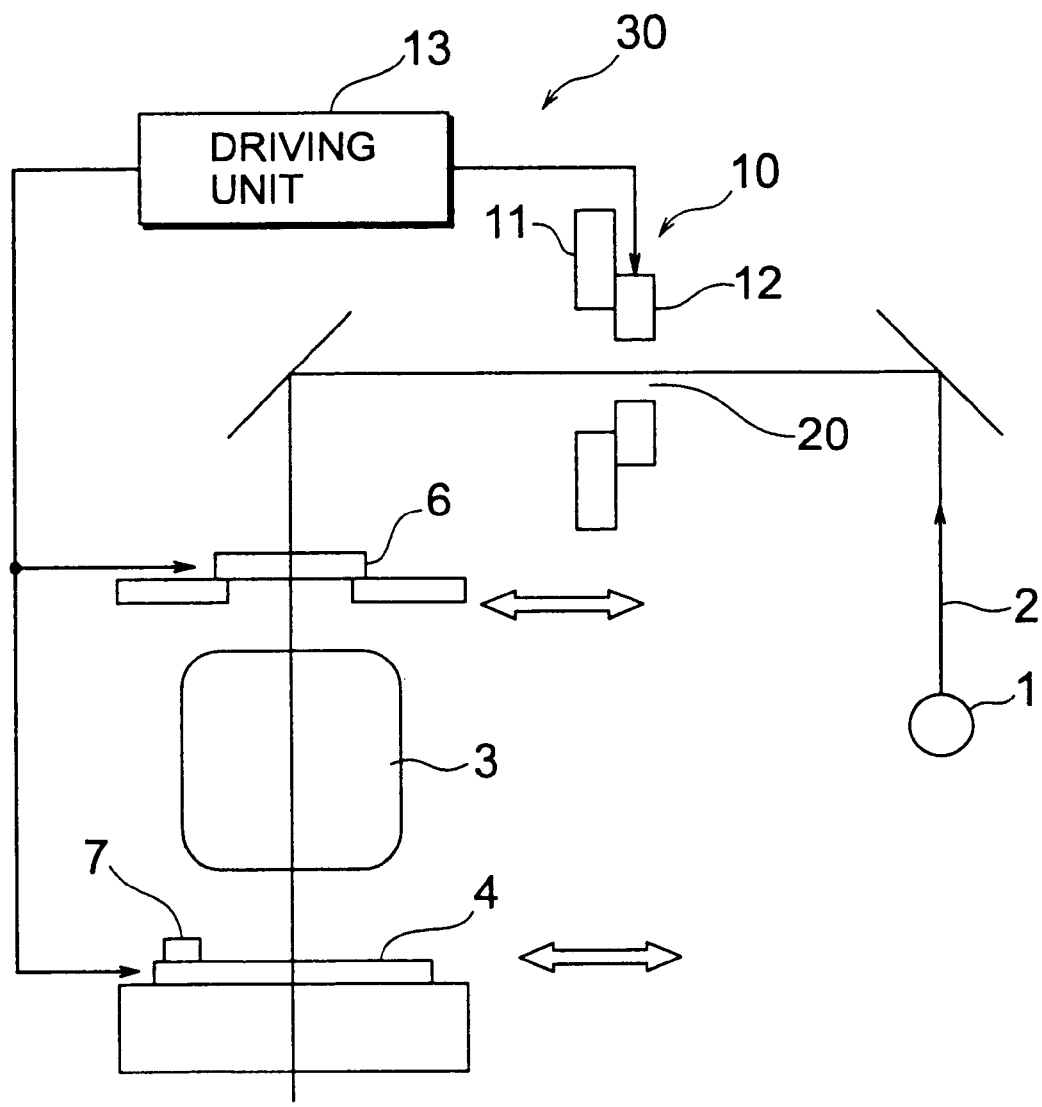
FIG. 2A shows a scanning type exposure apparatus according to this invention.
Figure 3A:
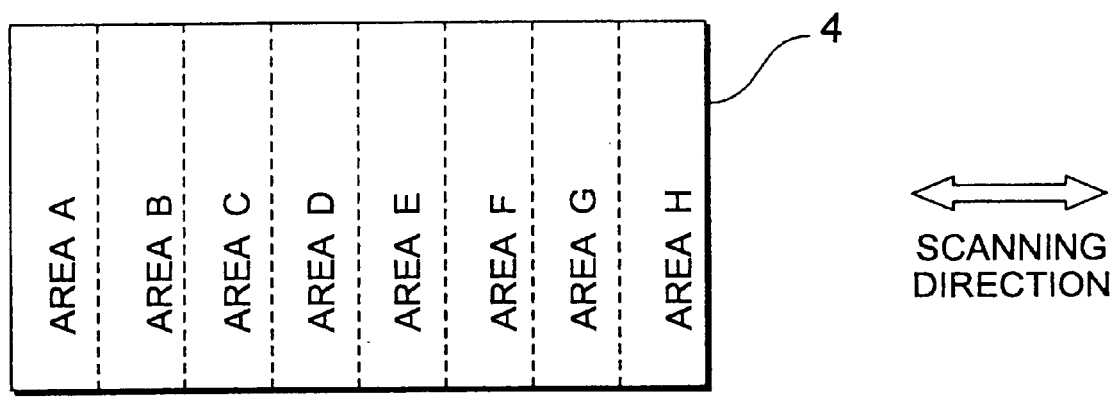
FIG. 3A is a plan view showing a state in which a substrate is divided into a plurality of regions.
Figure 3B:
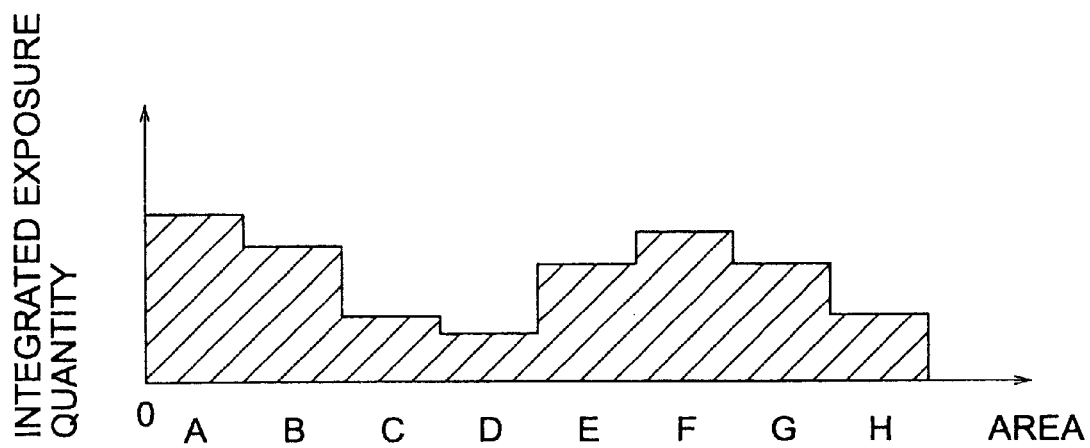
FIG. 3B is a graph showing integrated exposure quantity for each region on a substrate.
Figure 3C:
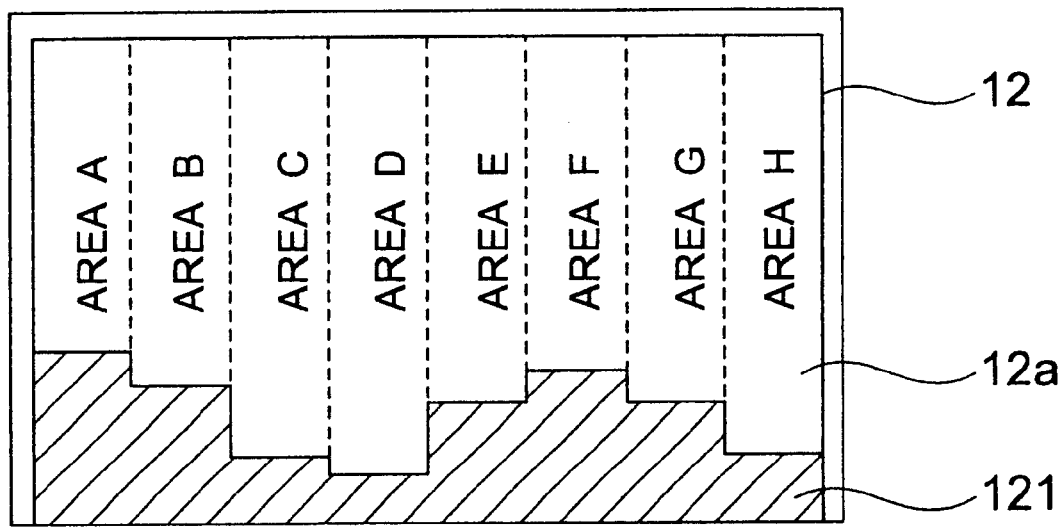
FIG. 3C is a plan view showing a second shielding plate for adjusting exposure quantity.
Figure 4:
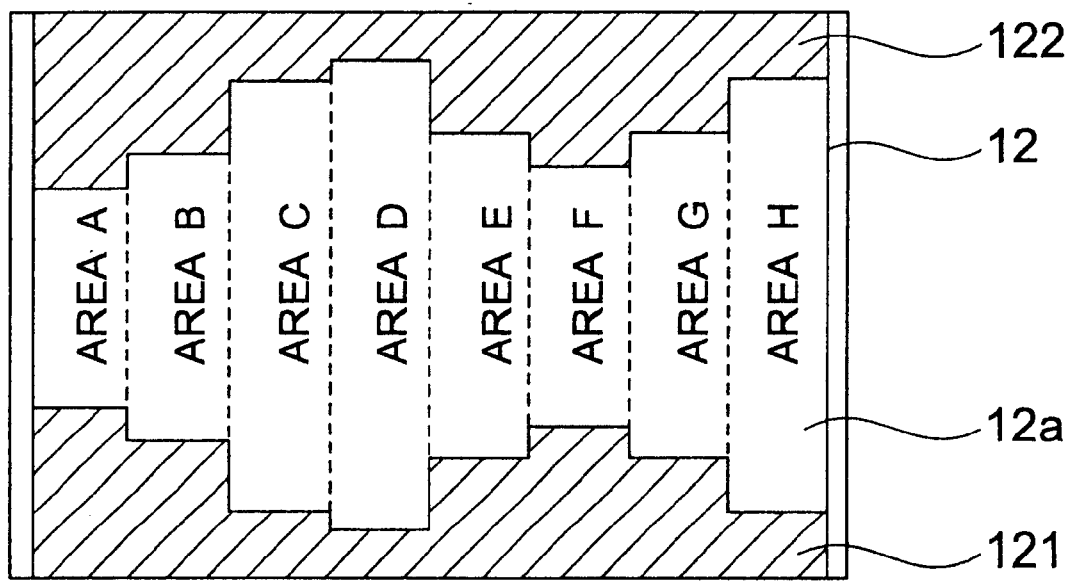
FIG. 4 is a plan view showing an alternative second shielding plate for adjusting exposure quantity.

Referring to FIG. 2 through FIG. 4, a scanning apparatus according to this invention will now be described.

An illumination light beam 2 from a light source 1 is introduced onto a reticle 6 via an opening portion 20 of a reticle blind 10 in the scanning type exposure apparatus.

With such a structure, a pattern on the reticle 6 is sequentially transferred onto the substrate 4 by scanning the reticle 6 and the substrate 4, respectively.

Under this circumstance, the substrate 4 is divided into a plurality of regions A through H along a scanning direction of the substrate 4, as shown in FIG. 3A.

Further, variable unit 30 of an opening portion area is arranged so as to change the opening area of the opening portion 20 of the reticle blind 10 to substantially equalize integrated exposure quantity in each region. Herein, the variable unit 30 is preferably composed of a first light shielding plate 11 having an aperture and a second light shielding plate 12 having a plurality of rectangular apertures of varying dimensions adjacent to one another.

In this condition, the variable unit 30 is controlled by synchronizing the reticle with the substrate 4 via a driving unit 13.

Further, the illumination light beam 2 from the light source 1 is introduced onto the reticle 6 via the opening portion 20 of the reticle blind 10. The pattern on the reticle 6 is sequentially transferred by scanning the reticle 6 and the substrate 4, respectively.

The reticle blind 10 forms the opening portion 20 by overlapping the first light shielding plate 11 with the second light shielding plate 12.

Figure 2B:
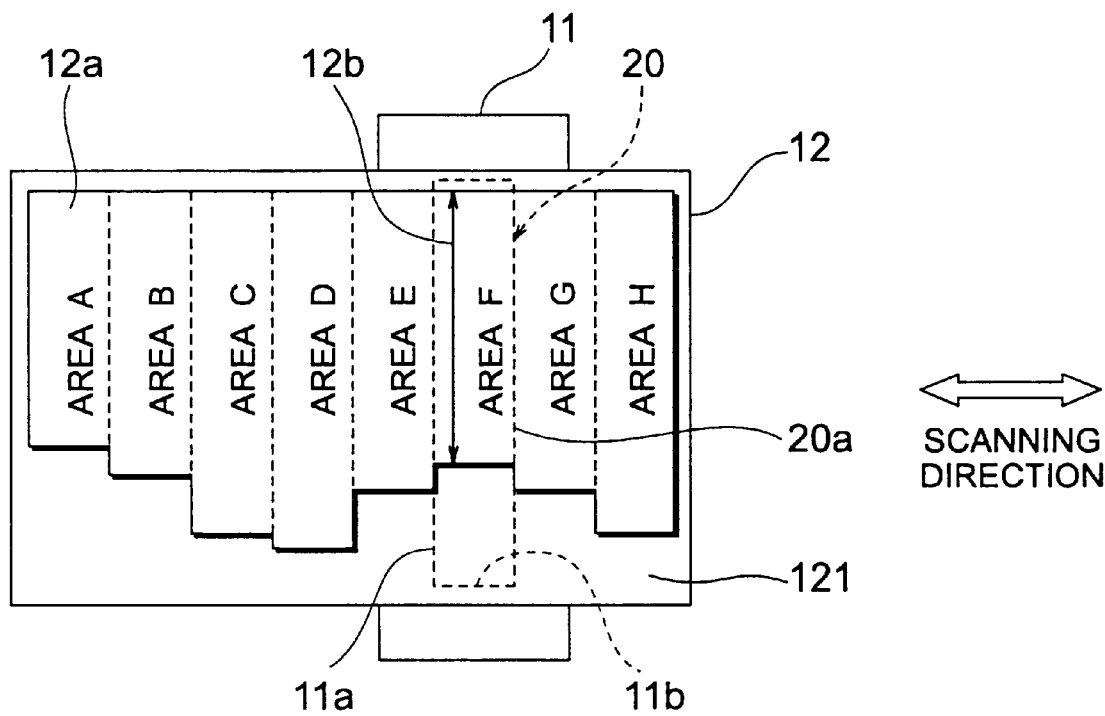
FIG. 2B shows a state in which a first light shielding plate and a second light shielding plate are overlapped so as to control an opening portion of a reticle blind.

Under this circumstance, a side parallel to the scanning direction of the opening portion 20 constitutes one side 11b of the opening portion 11a formed in the first light shielding plate 11, as illustrated in FIG. 2B.

The length 12b of a side perpendicular to the scanning direction of the opening portion 20 of the reticle blind is determined by the second shielding plate 12.

Moreover, the driving unit 13 drives either the first 11 or second 12 light shielding plate in synchronism with the scanning between the reticle 6 and the substrate 4.

The length 12b of a side 20a perpendicular to the scanning direction of the opening portion 20 of the reticle blind 10 is determined on the basis of an adjusting region 121 provided at one side portion parallel to the scanning direction of the second light shielding plate 12, as illustrated in FIG. 3C.

Alternatively, the length 12b of the side 20a perpendicular to the scanning direction of the opening portion 20 of the reticle blind 10 may be determined on the basis of adjusting regions 121 and 122 provided at both side portions parallel to the scanning direction of the second light shielding plate 12, as illustrated in FIG. 4.

Referring to FIG. 2 through 4, the scanning apparatus according to this invention will now be described in further detail.

Figure 1:
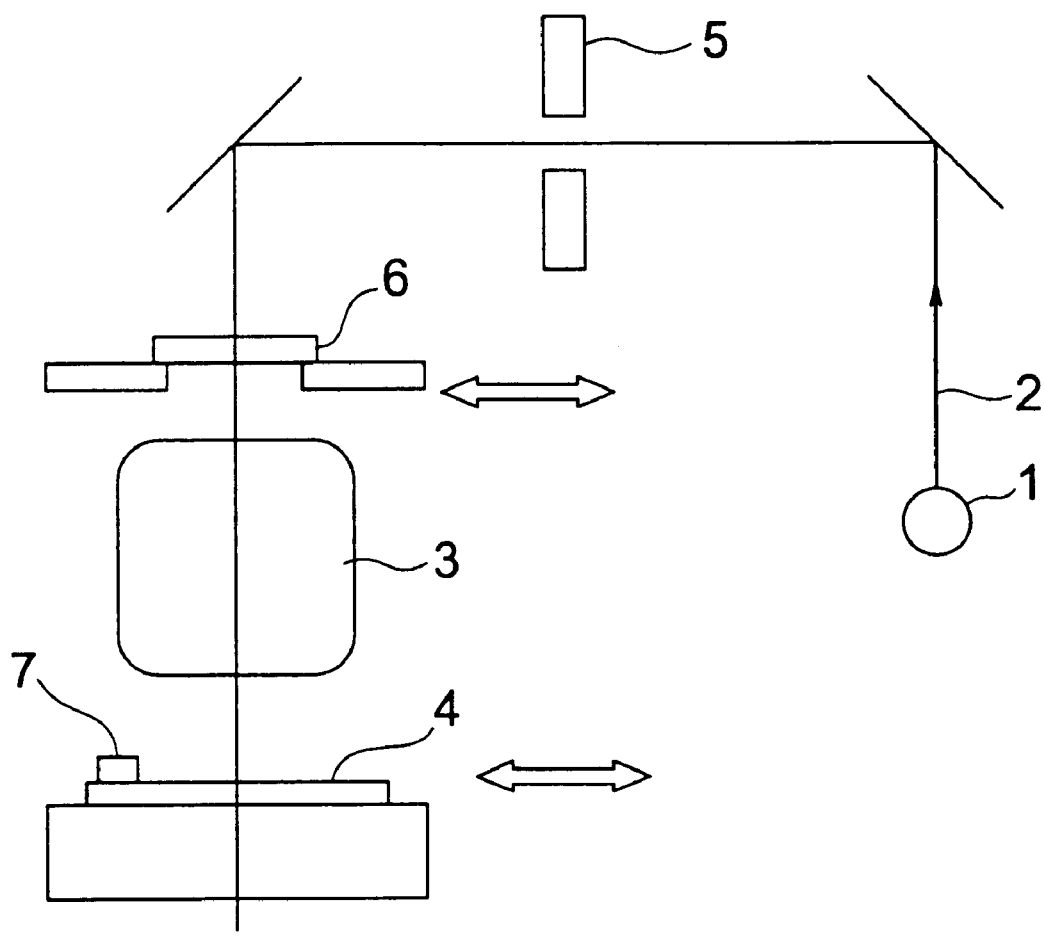
FIG. 1 shows a conventional scanning type exposure apparatus.

The scanning type exposure apparatus of this invention differs from the conventional scanning type apparatus illustrated in FIG. 1 in the structure of the reticle blind.

In the scanning type exposure apparatus of this invention, integrated quantity is first calculated for each region A through H on the basis of in-plane illuminance data illustrated in FIG. 3B obtained by an illuminance sensor 7. Herein, it is to be noted that the illuminance sensor 7 is shown in FIG. 2A.

In this case, the region A has highest exposure quantity, as shown in FIG. 3B. Further, the exposure quantity sequentially becomes lower in order of the region F, the region B, the region E, the region G, the region C, the region H, and the region D, as illustrated in FIG. 3B.

In order to equalize the exposure quantity for each region A through H, a region 121 is provided so as to adjust the exposure quantity in the light shielding plate 12, as illustrated in FIG. 3C.

Thereby, the area of the opening portion 20 of the reticle blind 10 becomes variable when each region A through H is exposed. Consequently, the exposure quantity becomes constant on the substrate 4.

Therefore, the area of the opening portion 20 of the reticle blind 10 is smallest in the region A, in FIG. 3B. Further, the area of the opening portion 20 sequentially becomes larger in order of the region B, the region E, the region G, the region C, the region H, and the region D by adjusting the adjusting region 121 of the second light shielding plate 12.

In FIG. 2B, the area of the opening portion 20 is controlled based on the first light shielding plate 11 and the second light shielding plate 12 overlapping each other.

Under such a circumstance, the side of the scanning direction of the opening portion 20 is determined on the basis of the dimension 11b of the opening portion 11a.

The side 20a perpendicular to the scanning direction of the opening portion 20 is determined based upon the length of the direction perpendicular the scanning direction of the opening portion 12a of the second light shielding plate 12.

Therefore, the length 12b is selected such that the integrated exposure quantity becomes constant in each region A through H.

Further, either one of the first light shielding plate 11 and the second light shielding plate 12 is scanned in the direction indicated by the arrow in synchronism with the scanning of the reticle 6 and the substrate 4.

Thereby, the integrated exposure quantity can be constantly controlled in each region A through H because the area of the opening portion 20 is variable.

A method of controlling the scanning type exposure apparatus of this invention will now be described.

The illumination light beam 2 from the light source 1 is introduced onto the reticle 6 through the opening portion 20 of the reticle blind 10, as illustrated in FIG. 2A.

The pattern on the reticle 6 is sequentially transferred on the substrate 4 by scanning the reticle 6 and the substrate 4, respectively.

Under this circumstance, the reticle 6 and substrate 4 are moved to a first position and a second position, respectively. In synchronism with this operation, the area of the opening portion 20 of the reticle blind 10 is changed from a first area to a second area.

Further, the opening portion 20 of the reticle blind 10 is variably controlled such that the integrated exposure quantity at the first position and the integrated exposure quantity become substantially constant on the substrate 4.

Thus, the exposure may be stably carried out on a substrate having a large area in a scanning type exposure apparatus consistent with this invention.

While this invention has thus far been disclosed in conjunction with several embodiments thereof, it will be readily possible for those skilled in the art to put this invention into practice in various other manners.

What is claimed is:

1. A scanning type exposure apparatus in which an illumination light beam from a light source through an opening portion of a reticle blind is introduced onto a reticle, and a pattern on the reticle is sequentially transferred onto the substrate by scanning the reticle and the substrate, respectively, wherein:

the substrate is divided into a plurality of regions along a scanning direction;

the reticle blind comprises a surface defined by a plurality of rectangular apertures of varying dimensions adjacent to one another formed in said surface; and a variable unit for changing an opening area of the opening portion of the reticle blind is arranged so as to substantially equalize integrated exposure quantity in each of the regions.

2. An apparatus as claimed in claim 1, wherein:

the variable unit is controlled in synchronism with the scanning of the reticle and the substrate.

3. A scanning type exposure apparatus in which an illumination light beam from a light source through an opening portion of a reticle blind is introduced onto a reticle, and a pattern on the reticle is sequentially transferred onto the substrate by scanning the reticle and the substrate, respectively, wherein:

the reticle blind forms the opening portion by overlapping a first light shielding plate with a second light shielding plate, a side parallel to the scanning direction of the opening portion is constituted of one side of the opening portion formed in the first light shielding plate;

a length of a side perpendicular to the scanning direction of the opening portion of the reticle blind is determined on the basis of the second light shielding plate; and wherein one said light shielding plate has a surface defined by a plurality of rectangular apertures of varying dimensions adjacent to one another formed in said surface.

4. An apparatus as claimed in claim 3, wherein:

a driving unit is arranged so as to drive either one of the first light shielding plate and the second light shielding plate in synchronism with the scanning of the reticle and the substrate.

5. An apparatus as claimed in claim 3, wherein:

the length is determined on the basis of an adjusting region provided at one side portion parallel to the scanning direction of the second light shielding plate.

6. An apparatus as claimed in claim 3, wherein:

the length is determined on the basis of adjusting regions provided at both side portions parallel to the scanning direction of the second light shielding plate.

7. A method of controlling scanning type exposure apparatus in which an illumination light beam from a light source through an opening portion of a reticle blind is introduced onto a reticle, and a pattern on the reticle is sequentially transferred onto the substrate by scanning the reticle and the substrate, respectively comprising the steps of:

moving the reticle and substrate from a first position to a second position;

changing an area of the opening portion of the reticle blind from a first area to a second area, and variably controlling the opening portion of the reticle blind such that first integrated exposure quantity at the first position and second integrated exposure quantity at the second position becomes substantially constant on the substrate; and wherein said reticle blind comprises a surface defined by a plurality of rectangular apertures of varying dimensions adjacent to one another formed in said surface.

* * * * *